(12) United States Patent
Lin et al.

(10) Patent No.: US 11,456,405 B2
(45) Date of Patent: Sep. 27, 2022

(54) CHIP BONDING REGION OF A CARRIER OF LIGHT EMITTING PACKAGE AND MANUFACTURING METHOD THEREOF

(71) Applicants: LITE-ON OPTO TECHNOLOGY (CHANGZHOU) CO., LTD., Changzhou (CN); LITE-ON TECHNOLOGY CORPORATION, Taipei (TW)

(72) Inventors: Chen-Hsiu Lin, New Taipei (TW); Chih-Yuan Chen, New Taipei (TW)

(73) Assignees: LITE-ON OPTO TECHNOLOGY (CHANGZHOU) CO., LTD., Changzhou (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 17/018,727

(22) Filed: Sep. 11, 2020

(65) Prior Publication Data

US 2021/0074896 A1 Mar. 11, 2021

(30) Foreign Application Priority Data

Sep. 11, 2019 (CN) .......................... 201910860863.9

(51) Int. Cl.
*H01L 29/18* (2006.01)
*H01L 33/00* (2010.01)
(Continued)

(52) U.S. Cl.
CPC .............. *H01L 33/62* (2013.01); *H01L 24/08* (2013.01); *H01L 24/80* (2013.01);
(Continued)

(58) Field of Classification Search
CPC ......... H01L 33/62; H01L 24/08; H01L 24/80; H01L 25/0753; H01L 33/486;
(Continued)

(56) References Cited

U.S. PATENT DOCUMENTS 9,101,048 B2 8/2015 Nakanishi et al.
9,362,472 B2 6/2016 Lin
(Continued)

FOREIGN PATENT DOCUMENTS

| CN | 103227263 A | 7/2013 |
| CN | 105023987 A | 11/2015 |
| CN | 108231717 A | 6/2018 |

*Primary Examiner* — Ismail A Muse
(74) *Attorney, Agent, or Firm* — Li & Cai Intellectual Property (USA) Office

(57) ABSTRACT

A light emitting package is provided, the light emitting package includes a carrier having a main part that has multiple chip bonding regions, and each the chip bonding regions has two neighboring conductive parts. An insulating part is disposed on the main part and portion of the two neighboring conductive parts, and multiple hollow-out structures are formed by the insulating part and corresponded in position to the chip bonding regions. Each of the hollow-out structures has a side wall that surrounds the chip bonding regions, and the portion of the tops of the two neighboring conductive parts are exposed from a bottom portion of the hollow-out structure, and multiple light emitting chips are disposed onto the chip bonding surfaces.

19 Claims, 12 Drawing Sheets

(51) Int. Cl.
  *H01L 33/62* (2010.01)
  *H01L 33/48* (2010.01)
  *H01L 25/075* (2006.01)
  *H01L 23/00* (2006.01)

(52) U.S. Cl.
  CPC ........ *H01L 25/0753* (2013.01); *H01L 33/486* (2013.01); *H01L 2224/0801* (2013.01); *H01L 2224/08225* (2013.01); *H01L 2224/80395* (2013.01); *H01L 2224/80815* (2013.01); *H01L 2933/0066* (2013.01)

(58) Field of Classification Search
  CPC ... H01L 2224/0801; H01L 2224/08225; H01L 2224/80395; H01L 2224/80815; H01L 2933/0066; H01L 33/54; H01L 2933/005
  See application file for complete search history.

(56) References Cited

U.S. PATENT DOCUMENTS

| | | | |
|---|---|---|---|
| 2013/0187190 A1* | 7/2013 | Muramatsu | H05K 13/00 257/99 |
| 2013/0192880 A1* | 8/2013 | Nakanishi | H05K 1/0201 174/251 |
| 2015/0200337 A1* | 7/2015 | Denda | H01L 33/60 257/99 |
| 2020/0313049 A1* | 10/2020 | Huang | H01L 33/60 |

* cited by examiner

CHIP BONDING REGION OF A CARRIER OF LIGHT EMITTING PACKAGE AND MANUFACTURING METHOD THEREOF

CROSS-REFERENCE TO RELATED PATENT APPLICATION

This application claims the benefit of priority to China Patent Application No. 201910860863.9, filed on Sep. 11, 2019 in China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a light emitting package, a manufacturing method thereof and a carrier, in particular to a light emitting package, a manufacturing method thereof, and a carrier, which are suitable for a light emitting packaging application.

BACKGROUND OF THE DISCLOSURE

A conventional light emitting package using a flip-chip packaging method needs to solder a light emitting chip onto a solder pad of a substrate through a solder. Since the technology of light emitting diodes is moving toward miniaturization, a soldering area of a chip solder pad and a gap of the chip solder pad has become smaller as a size of the chip is reduced. Therefore, a precision requirement for soldering is increased and a control of soldering overflow becomes stricter during a reflow process.

Especially in technical fields of MiniLED and MicroLED, sizes of the light emitting diodes have become smaller and densities of chip arrangements have also increased. Therefore, in a manufacturing process involving a transfer of high volume of chips, defects are easier to occur from erroneous soldering tin amounts and soldering overflow.

SUMMARY OF THE DISCLOSURE

The aim of the present disclosure is to solve the technical problems of difficulties in controlling soldering tin amounts and occurrences of soldering overflows in a conventional light emitting package.

In response to the above technical inadequacies, the present disclosure provides a light emitting package which includes a carrier, at least one light emitting chip, and a sealant. The carrier has at least one chip bonding region that is defined by at least two neighboring conductive parts and at least one hollow-out structure formed at a portion of an insulating part, in which a top of the insulating part is greater than tops of the least two neighboring conductive parts. The at least one hollow-out structure formed at a portion of the insulating part corresponds in position to the at least one chip bonding region, in which the at least one hollow-out structure has a side wall surrounding the at least one chip bonding region and a bottom portion being parallel to the at least one chip bonding region, and portions of the tops of the at least two neighboring conductive parts are exposed from the bottom portion, and the tops of the at least two neighboring conductive parts corresponding in position to the at least one hollow-out structure are defined as the at least one chip bonding region. The at least one light emitting chip is disposed on the at least one chip bonding region and electrically connected with the exposed portions of the at least two neighboring conductive parts. The sealant is disposed on the carrier and surrounding the at least one light emitting chip.

In one aspect, the present disclosure also provides a manufacturing method of a light emitting package and a carrier for the light emitting package.

Therefore, a beneficial effect of the present disclosure is to allow precise control over soldering overflow and soldering tin amounts, so as to reduce defect rates.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
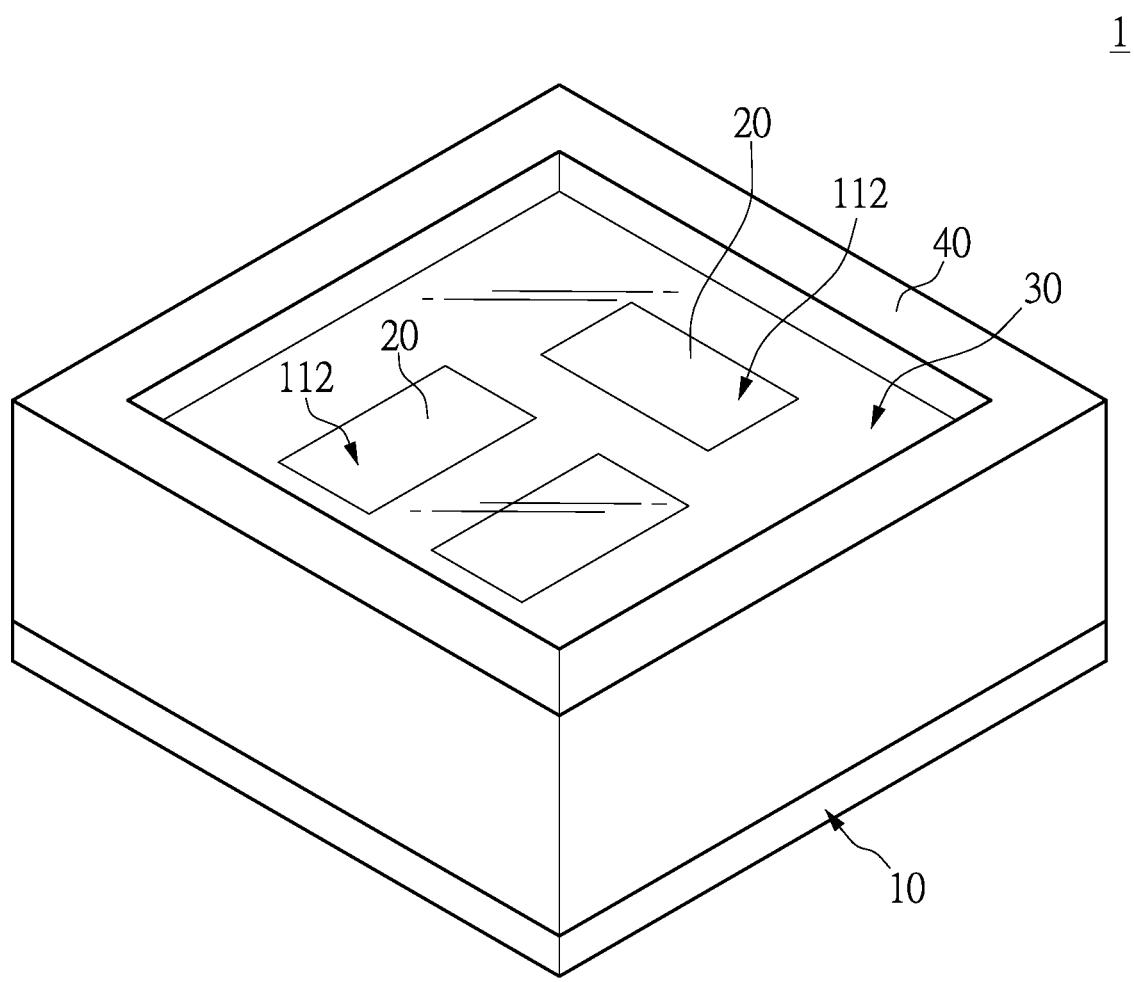
FIG. 1 is a perspective view of a light emitting package according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
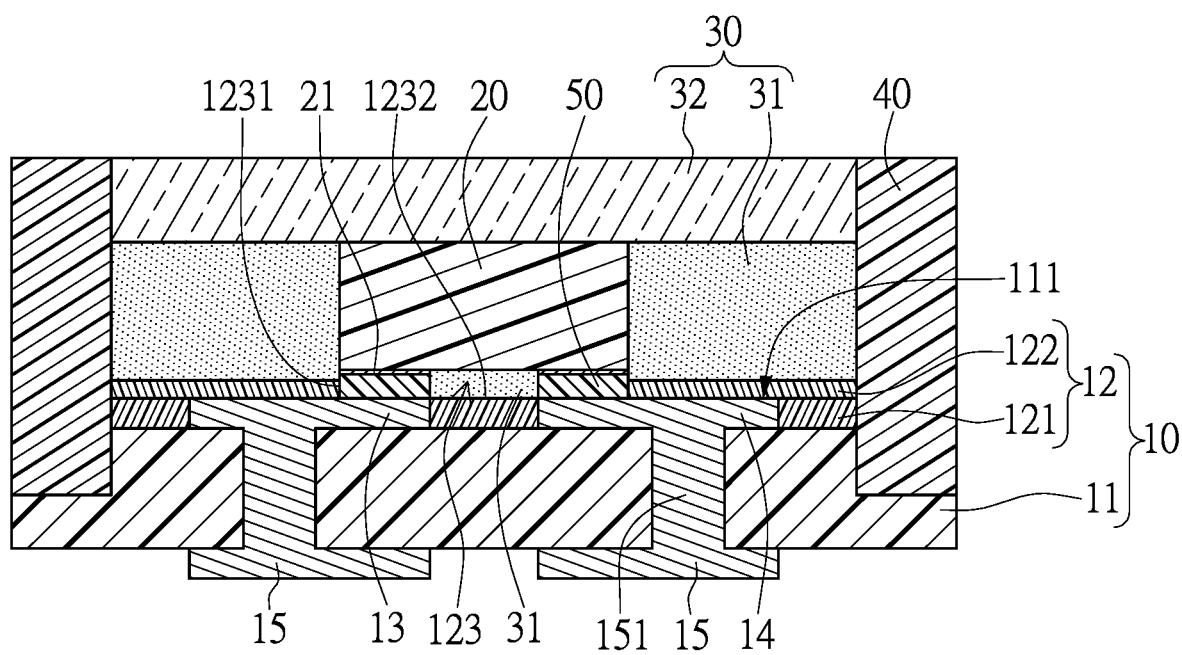
FIG. 2 is a sectional view of the light emitting package according to the first embodiment of the present disclosure.
Figure 3:
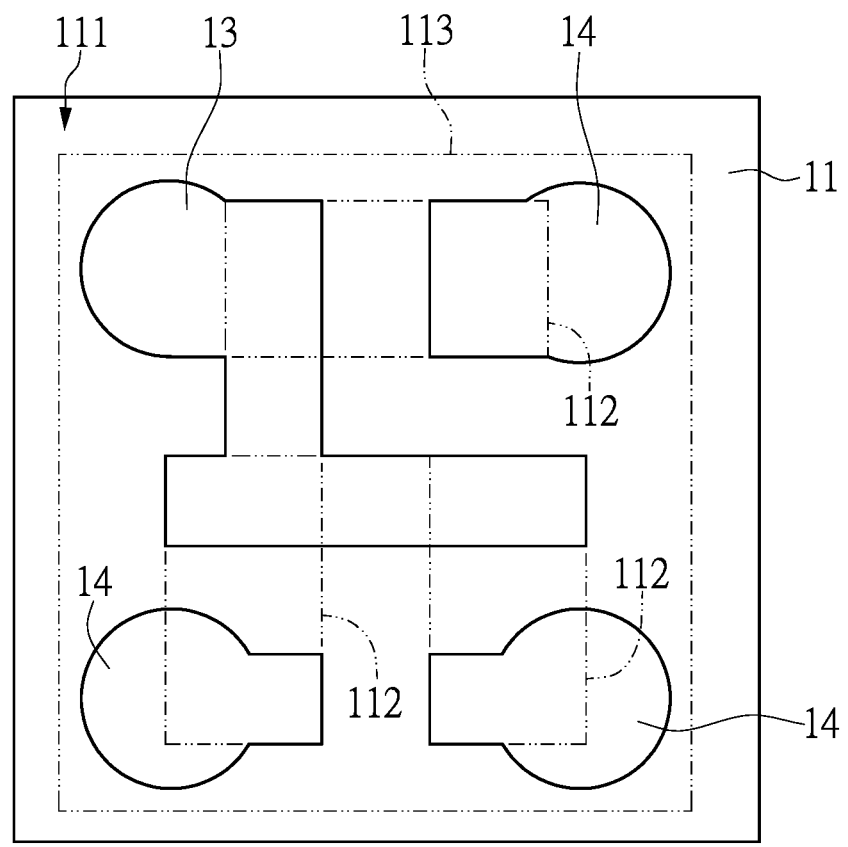
FIG. 3 is a top view of a main part of the light emitting package according to the first embodiment of the present disclosure.

Referring to FIGS. 1-3, a first embodiment provides a light emitting package 1, including: a carrier 10 having a main part 11, conductive parts 13,14, and an insulating part 12, a plurality of light emitting chips 20 mounted on the conductive parts 13,14, and a sealant 30 covering the plurality of light emitting chips 20. In the present embodiment, the insulating part 12 can be a multiple solder mask layer, but the present disclosure is not limited thereto.

Referring to FIGS. 2 and 3, in the present embodiment, a top of the carrier 10 has a chip mounting surface 111, the chip mounting surface 111 has a plurality of chip bonding regions 112, each of the chip bonding regions 112 includes two neighboring conductive parts that can be respectively defined as a first contact 13 and a second contact 14, in which a light emitting chip 20 is disposed on at least one of the first contact 13 and the second contact 14 of the corresponding chip bonding region 112, and the light emitting chip 20 is electrically connected with the exposed portions of the first contact 13 and the second contact 14. In this embodiment, the first contact 13 and the second contact 14 are provided for mounting a light emitting chip 20. It should be noted that a quantity of the neighboring conductive parts of each of the chip bonding regions 112 can be at least two. The first contact 13 and the second contact 14 have different polarities, for example, the first contact 13 and the second contact 14 may be an anode and a cathode, respectively. A plurality of solder pads 15 are disposed on a bottom side of the main part 11 of the carrier 10. The solder pads 15 are respectively and electrically connected to the plurality of first contacts 13 and second contacts 14 through a plurality of conductive structures 151 (such as via holes) that are disposed within the main part 11 of the carrier 10. Two electrodes 21 are disposed on a bottom surface of the light emitting chip 20, the two electrodes 21 are respectively a P-type electrode and an N-type electrode, and the two electrodes 21 may be respectively bonded onto the corresponding first contacts 13 and second contacts 14 by a flip-chip method.

The chip mounting surface 111 of the carrier 10 further combines the plurality of adjacent chip bonding regions 112 into a light emitting array 113. Referring to FIGS. 1 and 3, in the present embodiment, the light emitting array 113 is defined by three adjacent chip bonding regions 112. The three chip bonding regions 112 of the light emitting array 113 respectively have three light emitting chips 20 disposed therein to output lights of different colors (i.e., three primary colors of red, green, and blue lights). In addition, the purpose of light mixing or light dimming is achieved by adjusting an output ratio of the different light emitting chips 20.

Further, each of the chip bonding regions 112 defines a longitudinal direction. The first contact 13 and the second contact 14 of each of the chip bonding regions 112 are respectively disposed at two ends of the chip bonding region 112 along the longitudinal direction. In the present embodiment, each of the light emitting arrays 113 includes the three chip bonding regions 112, in which two of the three chip bonding regions 112 are arranged side-by-side and the corresponding two longitudinal directions thereof are parallel to each other, a remaining one of the three chip bonding regions 112 is disposed at one side of the longitudinal direction of two of the three chip bonding regions 112 arranged side-by-side, and the longitudinal direction of the two of the three chip bonding regions 112 that are arranged side-by-side are perpendicular to the longitudinal direction of the remaining one of three chip bonding regions 112.

Referring to FIG. 3, in the present embodiment, within each of the light emitting arrays 113, the first contacts 13 of the three adjacent chip bonding regions 112 are connected to a same conductive metal layer in order to simplify a configuration of the conductive structure 151 within the main part 11, on the other hand, the second contacts 14 of the three adjacent chip bonding regions 112 are independent from each other. According to the above configuration, the three first contacts 13 within each of the light emitting arrays 113 are connected to one solder pad 15 through one conductive structure 151, on the other hand, the three second contacts 14 within each of the light emitting arrays 113 are connected to three solder pads 15 through three conductive structures 151, respectively. Therefore, numbers of the solder pads 15 of the main part 11 and the conductive structures 151 can be reduced, and each of the light emitting chips 20 within each of the light emitting arrays 113 is able to perform dimming independently.

Figure 9:
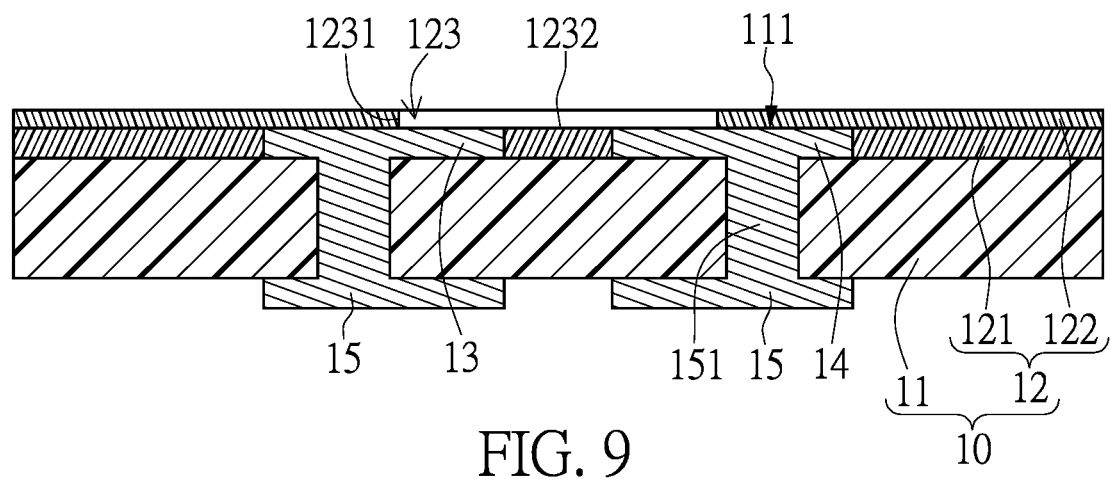
FIG. 9 is an operational schematic view of a second coating setting procedure according to the embodiment of the present disclosure.
Figure 10:
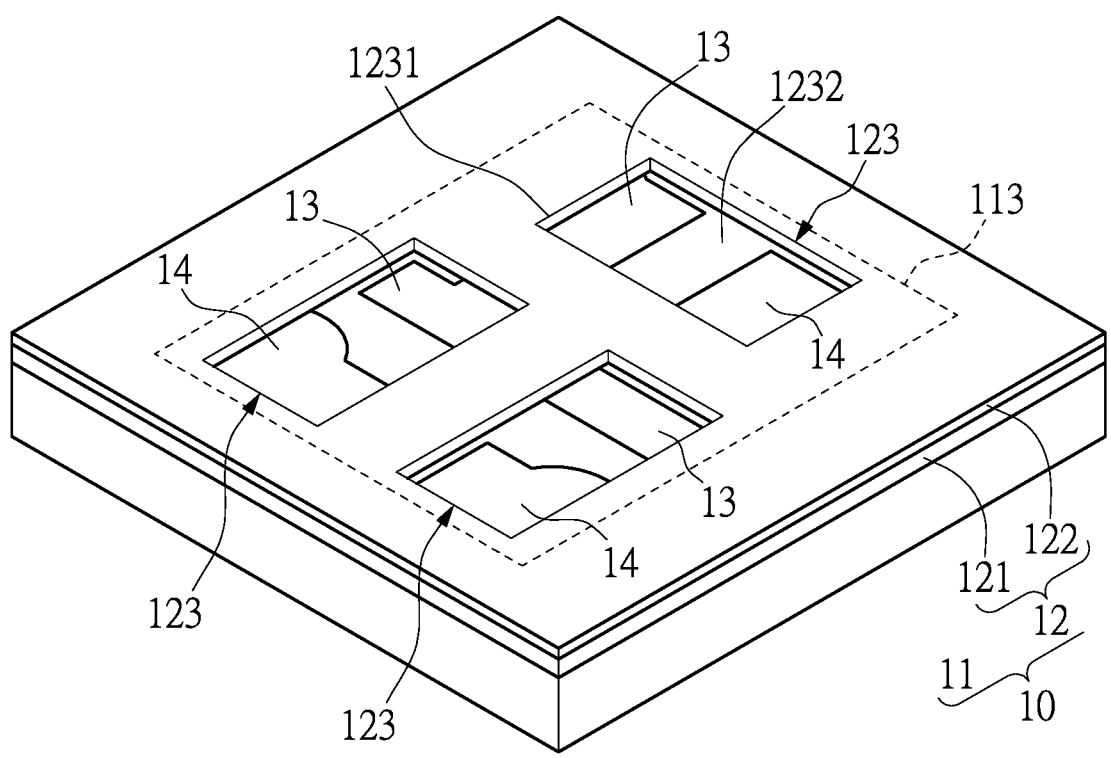
FIG. 10 is a perspective view of a carrier according to the embodiment of the present disclosure.

Referring to FIGS. 2, 9 and 10, the insulating part 12 is disposed on the main part 11 of the carrier 10, and the insulating part 12 covers most areas of the chip mounting surface 111. In addition, the plurality of first contacts 13 and the second contacts 14 on the chip mounting surface 111 are also surrounded by the insulating part 12. The total thickness of the insulating part 12 is greater than a thicknesses of the insulating part 12 at the position of the first contact 13 and second contact 14, so that a height of a top of the insulating part 12 is greater than the heights of the tops of the first contact 13 and second contact 14. The insulating part 12 forms a plurality of hollow-out structures 123 corresponding in position to the chip bonding regions 112, respectively. A contour shape of each of the hollow-out structures 123 and a contour shape of the corresponding chip bonding regions 112 are matched to each other. In addition, an area of each of the hollow-out structures 123 is equal to or slightly greater than an area of the corresponding chip bonding regions 112.

Referring to FIGS. 9 and 10, the hollow-out structure 123 is recessed from the top of the insulating part 12 and does not penetrate the bottom surface of the insulating part 12, so that the hollow-out structure 123 forms a blind hole recessed from the top of the insulating part 12. Each of the hollow-out structures 123 includes an annular side wall 1231 and a bottom portion 1232, in which the bottom portion 1232 and the insulating part 12 are preferably flat, but it is not limited thereto. A size of the hollow-out structure 123 can be slightly larger than the light emitting chips 20, but it is not limited thereto. The annular side wall 1231 surrounds an outside of the chip bonding regions 112, and the bottom portion 1232 is connected to a bottom edge of the annular side wall 1231 and is parallel to the chip mounting surface 111. A height difference of the bottom portion 1232 of the hollow-out structure 123 relative to the chip mounting surface 111 is approximately the same as a height difference of the bottom portion 1232 of the hollow-out structure 123 relative to the soldering surfaces of the first contacts 13 and second contacts 14. Therefore, the bottom portion 1232 of the hollow-out structure 123 is approximately flush with tops of the first contact 13 and the second contact 14, so that the tops of the first contact 13 and the second contact 14 are exposed from the bottom portion 1232.

Referring to FIGS. 9 and 10, the first contact 13 and the second contact 14 are exposed within the hollow-out structure 123, that is, the tops of the first contact 13 and the second contact 14 are not covered by the insulating part 12. Therefore, chip bonding regions are defined and used for the P-type or N-type electrode 21 of the light emitting chips 20 to be soldered on the chip bonding regions by the flip-chip method. A bonding layer 50 is disposed on the chip bonding regions of the first contact 13 and the second contact 14, and the bonding layers 50 are melted by a method of reflow, so that the P-type or N-type electrode 21 of the light emitting chips 20 is soldered onto the chip bonding regions of the corresponding first contact 13 and second contact 14 by the flip-chip method, and the light emitting chips 20 are fixed to the chip bonding regions 112. In addition, the electrodes 21 of the light emitting chips 20, the first contacts 13 and the second contacts 14 are electrically connected to each other.

Figure 8:
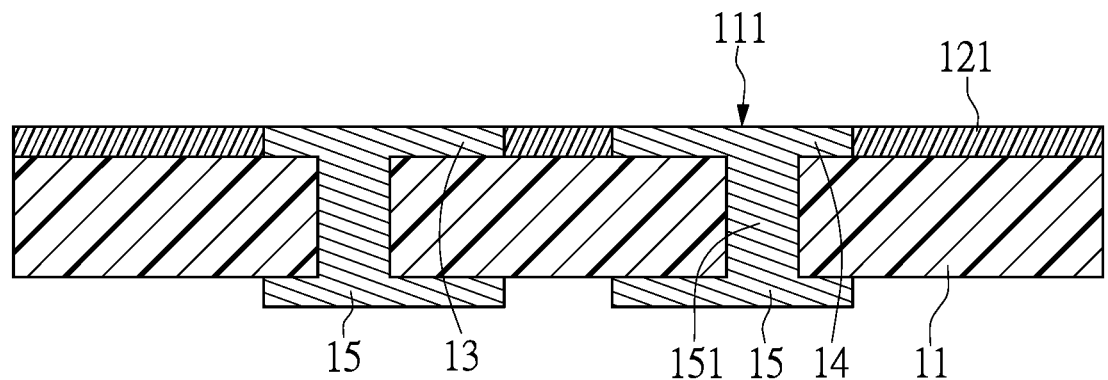
FIG. 8 is an operational schematic view of a first coating setting procedure according to the embodiment of the present disclosure.

In the present embodiment, the top of the insulating part 12 is arranged to be higher than the tops of the first contact 13 and second contact 14, so that a height of the annular side wall 1231 of each of the hollow-out structures 123 is higher than heights of the chip contact surface. Therefore, the bonding layer 50 on the chip bonding regions of the first contact 13 and second contact 14 are restricted by the annular side wall 1231 and are unable to overflow to an outside of the annular side wall 1231. Referring to FIG. 8 to FIG. 10, a gap is maintained between the first contact 13 and the second contact 14 within the hollow portion 123, and the gap between the first contact 13 and the second contact 14 within the hollow portion 123 is filled with a first coating 121, so that the tops of the first contact 13 and the second contact 14 are flush with a top of the first coating 121 (that is the bottom portion 1232).

It should be noted that, in a preferred embodiment, the top of the insulating part 12 relative to the tops of the first contact 13 and the second contact 14 is within a range of 15-30 μm, and a top of the bonding layer 50 relative to the top of the insulating part 12 is within a range of 5-25 μm. Furthermore, the bonding layer 50 is made of a solder material.

In the present embodiment, the insulating part 12 is formed by the first coating 121 and a second coating 122, in which the first coating 121 is disposed on the carrier 10 and surrounds each of the first contacts 13 and the second contacts 14, and in which the first coating 121 and a second coating 122 can be the first solder mask layer and the second solder mask layer. A thickness of the first coating 121 is approximately equal to the thicknesses of the first contact 13 and the second contact 14, so that the tops of the first contact 13 and the second contact 14 are exposed from a top of the first coating 121. The second coating 122 is disposed on a side of the first coating 121 opposite to the chip mounting surface 111. Referring to FIGS. 9 and 10, in the present embodiment, the hollow portion 123 is formed by providing an aperture on the second coating 122, so that the annular side wall 1231 of the hollow portion 123 is formed in the second coating 122, and the top of the first coating 121 defines the bottom portion 1232 of the hollow portion 123.

It should be noted that, although the present embodiment discloses that the insulating part 12 is a multiple layer structure composed of the first coating 121 and the second coating 122, the present disclosure is not limited thereto. In practical applications, the insulating part 12 may be a single layer structure.

Referring to FIG. 2, the sealant 30 is further disposed on the carrier 10, the sealant 30 adheres to the main part 11, and the plurality of light emitting chips 20 are covered inside the sealant 30. The sealant 30 further includes an underfill formed between the bottom portion 1232 of the hollow-out structure 123 and the plurality of light emitting chips 20. In the present embodiment, the sealant 30 has a first sealant 31 and a second sealant 32, in which the first sealant 31 is disposed on the carrier 10, and surrounds the plurality of light emitting chips 20. In addition, a top of the sealant 31 is approximately flush with a top of the light emitting chips 20, in which the top of the light emitting chip 20 is exposed from a top of the first sealant 31. The second sealant 32 is disposed on the top of the first sealant 31 and covers the tops of the plurality of light emitting chips 20.

Specifically speaking, in the present embodiment, the first sealant 31 may be made of a white material, and the second sealant 32 may be made of a transparent material, so that the first sealant 31 forms a white wall structure that surrounds a periphery of the light emitting chip 20 and the white wall structure is able to reflect light generated by the light emitting chips 20. Furthermore, the second sealant is a light-transmitting structure, so that the light generated by the light emitting chips 20 is able to pass through the second sealant 32. In addition to the first sealant 31 being made of the white material, the first sealant 31 may also be made of an opaque material in another embodiment, such as a black material.

In addition, in a preferred embodiment, a light-reflecting material (i.e., alumina or titanium dioxide) may be added to the first sealant 31 or the second sealant 32 in order to improve light emitting efficiency or light mixing effect of the light emitting chips 20.

The light emitting package 1 of the present embodiment further has a surrounding structure 40 disposed on a periphery of the main part 11, the top of the surrounding structure 40 is flush with a top of the sealant 30, and the surrounding structure 40 surrounds outsides of the light emitting chips 20 and the sealant 30. The surrounding structure 40 may be made of the opaque material, or be made of black and white materials, according to requirements.

Second Embodiment

Figure 4:
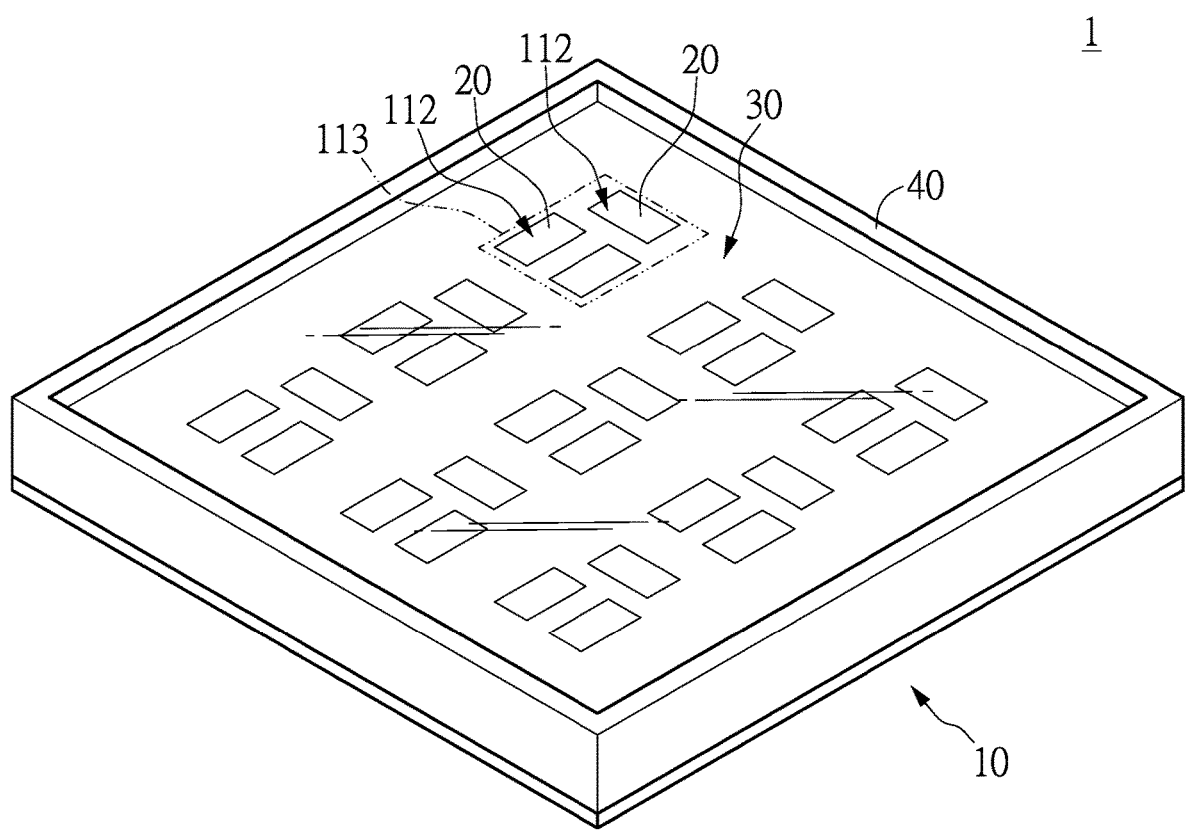
FIG. 4 is a perspective view of a light emitting package according to a second embodiment of the present disclosure.

Referring to FIG. 4, a schematic view of the light emitting package 1 of a second embodiment is illustrated, the technical contents of the present embodiment are mostly similar to that of the foregoing first embodiment, and will not be reiterated herein. The difference is that in the present embodiment, the plurality of light emitting arrays 113 that are different from each other is disposed on the carrier 10, each of the light emitting arrays 113 has a plurality of the chip bonding regions 112, and each of the chip bonding regions 112 has a light emitting chip 20 disposed therein. In the present embodiment, the arrangements of the chip bonding regions 112 and the light emitting chips 20 in each of the light emitting arrays 113 are similar with the first embodiment, and will not be reiterated herein.

Third Embodiment

Figure 5:
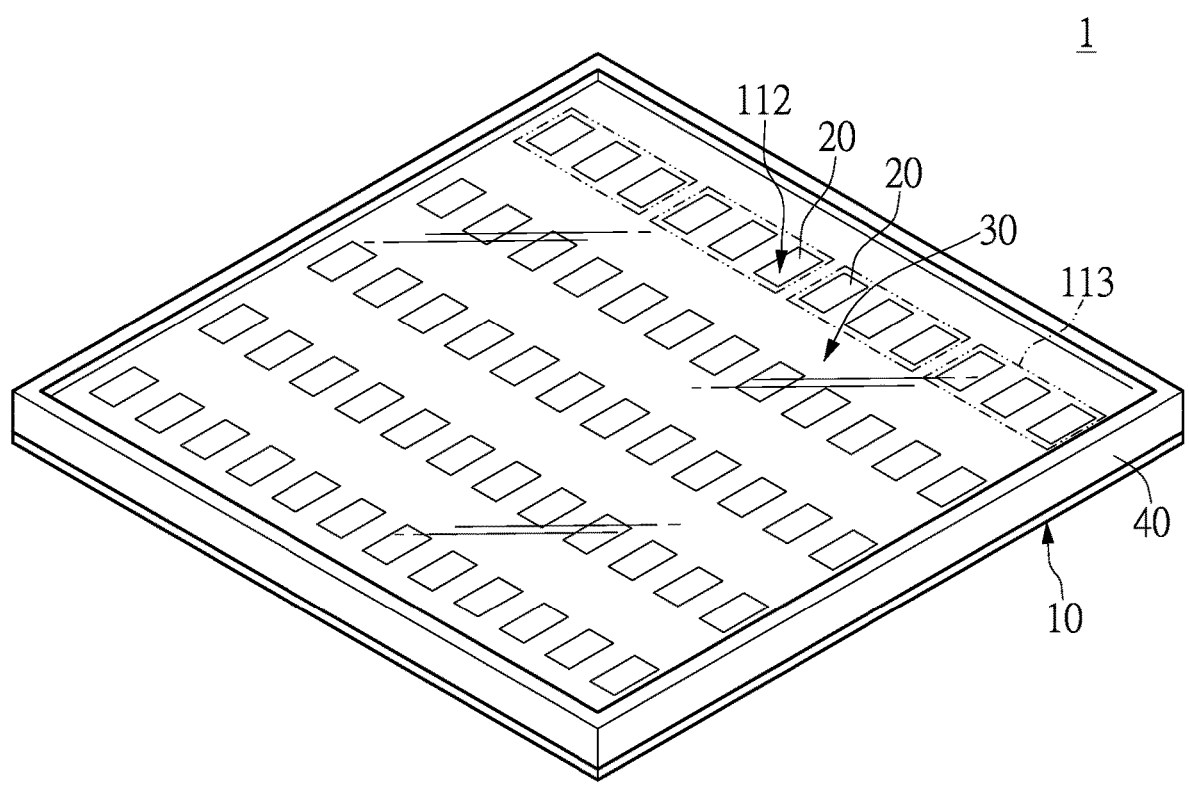
FIG. 5 is a perspective view of a light emitting package according to a third embodiment of the present disclosure.
Figure 6:
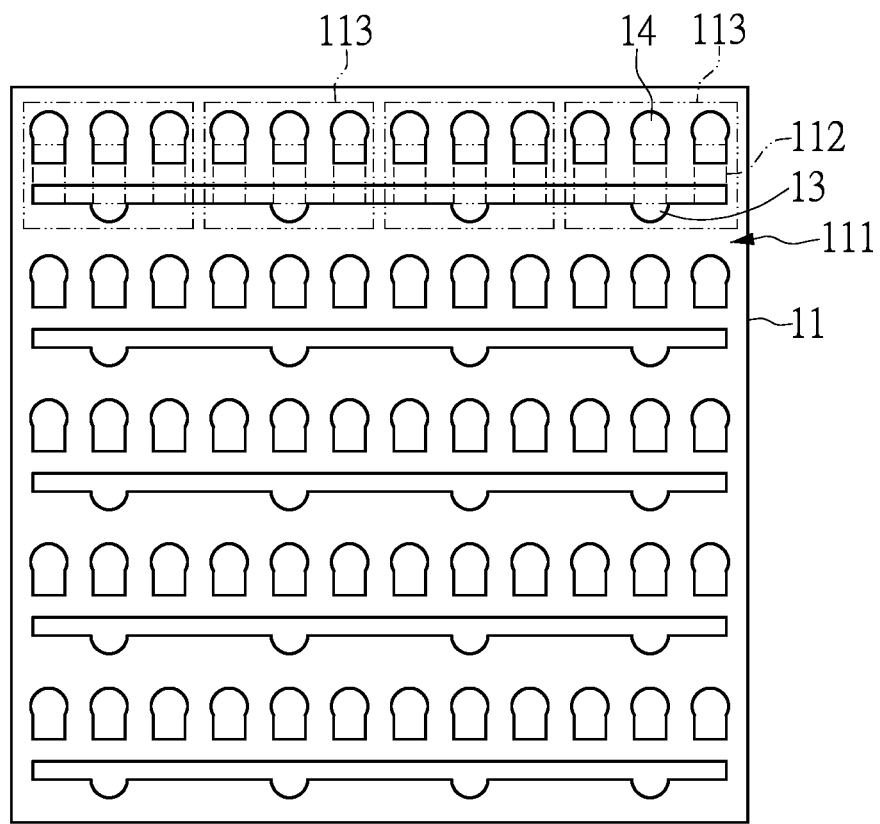
FIG. 6 is a top view of a main part of the light emitting package according to the third embodiment of the present disclosure.

Referring to FIGS. 5 and 6, schematic views of the light emitting package 1 and the carrier 10 according to a third embodiment are respectively illustrated, the technical contents of the present embodiment are mostly similar to that of the foregoing first embodiment, and will not be reiterated herein. The difference between the present embodiment and the first embodiment is the arrangements of each of the light emitting chips 20, the first contact 13 and the second contact 14 within the light emitting array 113 on the main part 11. In the present embodiment, the carrier 10 also has a plurality of the light emitting arrays 113, each of the light emitting arrays 113 has the chip bonding regions 112 arranged side-by-side, and longitudinal directions of the chip bonding regions 112 thereof are parallel to each other. Therefore, the light emitting chips 20 of each of the light emitting arrays 113 are arranged along a straight line.

Referring to FIG. 6, in the present embodiment, the plurality of the first contacts 13 of each of the light emitting arrays 113 are formed by a conductive metal layer that spans across multiple chip bonding regions 112, while the second contacts 14 of each of the light emitting arrays 113 are formed by the conductive metal layers that are independent from each other. Therefore, the first contacts 13 are connected to each other and the second contacts 14 are independent from each other in the same light emitting array 113, in which the light emitting chips 20 disposed on the three chip bonding regions 112 of the light emitting array 113 are able to be sequentially selected according to product design requirements, such as red, green and blue light chips configurations, but the present disclosure is not limited thereto.

Similarly, each of the chip bonding regions 112 defines one longitudinal direction, and the first contact 13 and the second contact 14 of each of the chip bonding regions 112 are respectively disposed at two ends of the chip bonding regions 112 along the longitudinal direction. In the present embodiment, the three chip bonding regions 112 of each of the light emitting arrays 113 are arranged side-by-side and parallel to each other.

Figure 11:
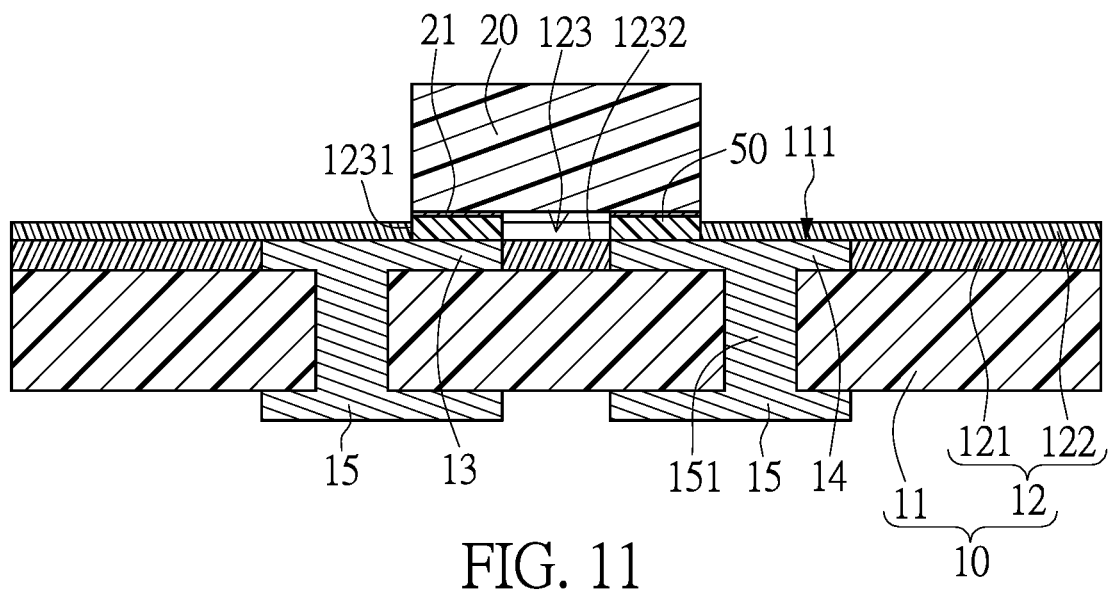
FIG. 11 is an operational schematic view of a preparation step and a chip bonding step according to the embodiment of the present disclosure.
Figure 12:
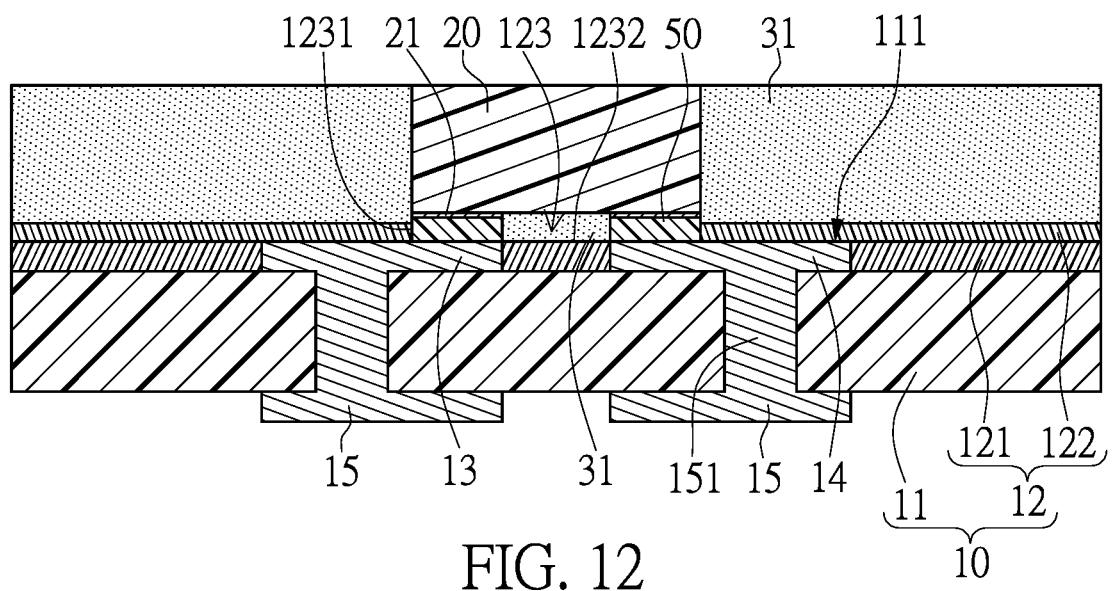
FIG. 12 is an operational schematic view of a first sealing step according to the embodiment of the present disclosure.

An embodiment further provides the carrier 10 for the light emitting package 1. Referring to FIGS. 11 and 12, the carrier 10 provided in the embodiment includes the main part 11 and insulating part 12 that is disposed on the main part 11. The carrier 10 has been specifically described in foregoing description, and will not be reiterated herein.

Manufacturing Method of Light Emitting Package

Figure 7:
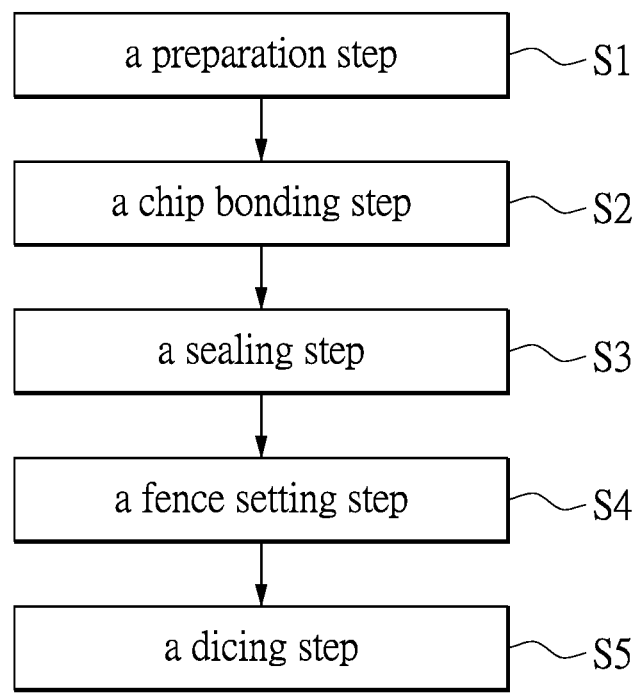
FIG. 7 is a flowchart of a manufacturing method of a light emitting package according to an embodiment of the present disclosure.

Referring to FIG. 7, a flowchart of a manufacturing method of the light emitting package 1 is illustrated, the manufacturing method of the light emitting package 1 mainly includes: a preparation step S1, a chip bonding step S2, a sealing step S3, a fence setting step S4 and a dicing step S5.

The manufacturing method of the light emitting package 1 of the present embodiment is described as follows. Firstly, the preparation step S1 is implemented by providing the carrier 10 as shown in the foregoing embodiments. In this step, a pre-processing step is implemented by cleaning the carrier 10 and the tops of the first contact 13 and the second contact 14 to facilitate the succeeding steps. Specifically speaking, the light emitting package 1 of the present embodiment may be a single package structure cut from a large area package structure. Therefore, the carrier 10 provided in the preparation step S1 of the present embodiment may be a large area substrate that has not been cut. Furthermore, the insulating part 12 in the present embodiment is composed of the first coating 121 and the second coating 122.

Referring to FIG. 8, a material of the first coating 121 is laid on the main part 11 of the carrier 10, and the thickness of the first coating 121 is approximately equal to or slightly greater than the thicknesses of the first contact 13 and the second contact 14, so as the first coating 121 and the conductive parts are combined to form the chip mounting surface 111. A grinding step is then implemented by using a roller or other grinding devices to grind the top of the first coating 121, so that the first coating 121 is flat, and the top of the first coating 121 is flush with the tops of the first contact 13 and the second contact 14, so that the tops of the first contact 13 and the second contact 14 are exposed from the first coating 121.

Specifically speaking, a material of the first coating 121 may be made of solder mask material or epoxy resin, and the grinding step is implemented when the material of the first coating 121 is in a semi-cured state. A preferable method utilizes a grinding roller with non-woven material to perform the grinding step on the top of the first coating 121, and to avoid the roller material damaging the tops of the first contact 13 or the second contact 14 and causing defects in products.

Referring to FIG. 9, the second coating 122 is disposed on the top of the first coating 121, and the hollow-out structure 123 on the second coating layer 122 is defined. The preparation step S1 of the present embodiment includes disposing the second coating 122 with a graphical method on the first coating 121 through a photomask development method. More specifically, a photoresist material may be disposed on the top of the first coating 121 and the tops of the first contact 13 and the second contact 14 in the preparation step S1 of the present embodiment, next, a plurality of photoresist patterns that are formed by the photomask development method are complementary in shape to the hollow-out structures 123, next, a material of the second coating layer 122 is disposed on the first coating layer 121, finally, the hollow-out structures 123 are formed at the second coating layer 122 after the photoresist patterns are removed.

Referring to FIGS. 9 and 10, the top of the insulating part 12 is higher than the tops of the first contact 13 and the second contact 14 after completing the preparation step S1.

A difference between a height of a top of the second coating 122 and the heights of tops of the first contact 13 and the second contact 14 is within a range of 15-30 μm. In addition, the tops of the first contact 13 and the second contact 14 of each of the chip bonding regions 112 are exposed from the hollow-out structure 123. Moreover, the tops of the first contact 13 and the second contact 14 that are exposed within a range of the hollow-out structures 123 form the chip bonding regions that is able to provide to the electrodes 21 of the light emitting chip 20 to perform flip-chip bonding.

Referring to FIG. 10, a finished product in this step is the carrier 10 that is provided in the embodiment after completing the preparation step S1.

Specifically speaking, the insulating part 12 has a single layer structure in another embodiment of the preparation step S1, a material of the insulating part 12 is disposed on the main part 11 of the carrier 10 in the preparation step S1 of the present embodiment. Next, a step of forming the hollow-out structure 123 is implemented by etching, laser processing or mechanical removing, the material of the insulating part 12 is partially removed at a predetermined position where the hollow-out structure 123 is disposed on the insulating part 12, so that the plurality of hollow-out structures 123 is formed on the insulating part 12.

Referring to FIG. 11, a schematic view of the chip bonding step S2 is illustrated, bonding materials such as solder are respectively disposed on the chip bonding regions of each of the first contacts 13 and the second contacts 14 in the chip bonding step S2. In the present embodiment, the bonding materials are disposed on the chip bonding regions of each of the first contacts 13 and the second contacts 14 through a template. The template has a plurality of apertures corresponding in position to the chip bonding regions of the first contact 13 and the second contact 14, and the bonding materials are coated or printed on the chip bonding regions through the plurality of apertures on the template.

More specifically, the template is a steel template in the chip bonding step S2 of the present embodiment, and the apertures corresponding in position to the chip bonding regions of the first contact 13 and the second contact 14 are disposed on the steel template. In a preferred embodiment, a total area of the apertures of the steel template ranges from of 80% to 120% of an area of the chip bonding regions within the hollow-out structure 123. In addition, the height of the top of the bonding layer 50 is higher than the height of the top of the insulating part 12, and a difference between the height of the top of the bonding layer 50 and the height of the top of the insulating part 12 is within a range of 5-25 μm to accurately control soldering tin amounts, so that the bonding layer 50 in subsequent reflow step is able to control a range of soldering overflows and maintain a sufficient thickness of the bonding layer 50.

Referring to FIG. 11, the chip bonding step S2 is implemented by disposing the light emitting chip 20 on the chip bonding regions 112, the electrodes 21 on bottom surfaces of each of the light emitting chips 20 are respectively contacted with the bonding layers 50 of the corresponding first contact 13 and second contact 14, after that, the bonding layers 50 are melted through a reflow step, so that the P-type or N-type electrode 21 of the light emitting chip 20 are soldered onto the corresponding first contact 13 and second contact 14, respectively.

Figure 13:
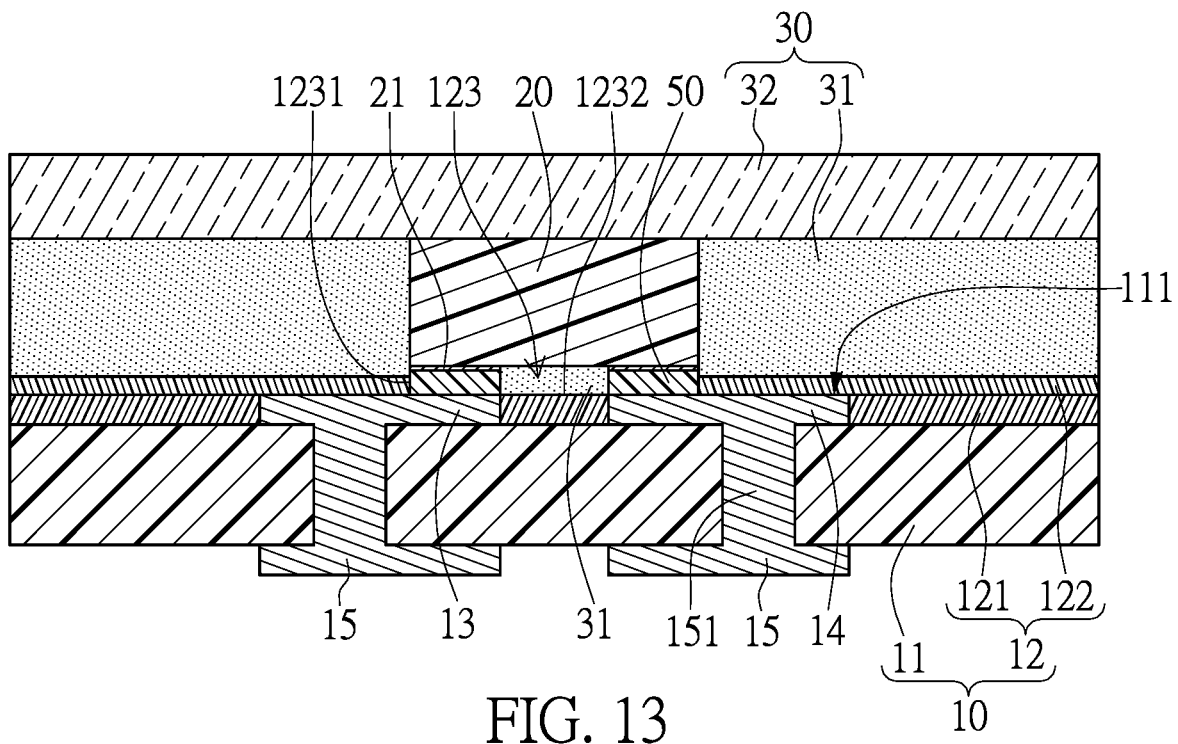
FIG. 13 is an operational schematic view of a second sealing step according to the embodiment of the present disclosure.

Referring to FIGS. 12 and 13, a schematic view of the sealing step S3 of the present embodiment is illustrated, in the present embodiment, the sealant 30 includes the first sealant 31 and the second sealant 32. Therefore, the sealing step S3 is also divided into a first sealing step and a second sealing step. Referring to FIG. 12, the first sealant 31 is disposed on the insulating part 12 in the first sealing step, and a top of the first sealant 31 is flush with the top of the light emitting chip 20, so that the tops of the plurality of the light emitting chips 20 are exposed from the top of the first sealant 31.

More specifically, in the present embodiment, the first sealant 31 may be made of a white silicone sheet, the first sealing step is implemented by covering a silicone sheet onto the top light emitting chip 20 to form the first sealant 31, next, a pressure is applied on the first sealant 31, so that the light emitting chip 20 passes through the silicone sheet, and a bottom surface of the silicone sheet is attached to the top of the insulating part 12. In addition, a top of the silicone sheet is flush with the top of the light emitting chip 20, and the silicone sheet is heated to form the first sealant 31. The first sealant 31 has fluidity after heating, so that the first sealant 31 is filled into the hollow-out structure 123. Moreover, a gap between the bottom surface of the light emitting chip 20 and the bottom portion 1232 is also filled with the first sealant 31.

Referring to FIG. 13, a transmissive material is disposed on the top of the first sealant 31 and the tops of each of the light emitting chips 20 to form the second sealant 32 in the second sealing step. The top of the light emitting chip 20 and the top of the first sealant 31 are completely covered by the second sealant 32 after completing the second sealing step. Therefore, the light emitting chip 20 is covered by the first sealant 31 and the second sealant 32, and the light emitting chip 20 can be protected by the sealant 30.

Figure 14:
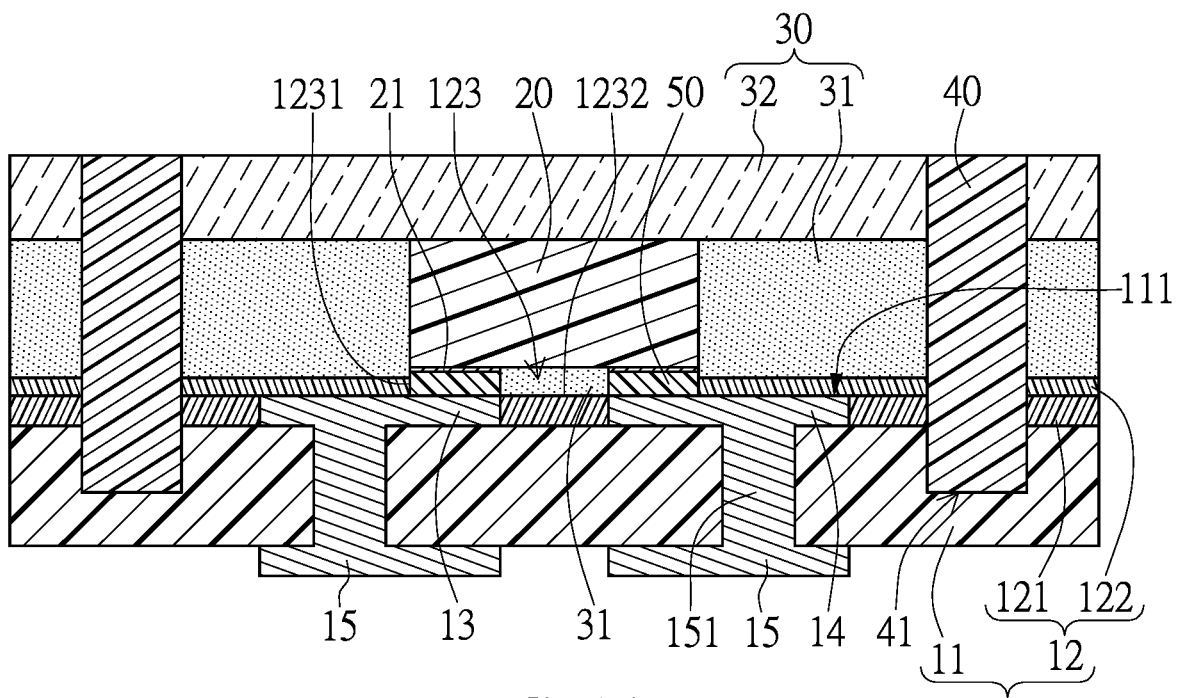
FIG. 14 is an operational schematic view of a slot dicing step and a surrounding body forming step in a fence configuration step according to the embodiment of the present disclosure.

Referring to FIG. 14, a schematic view of the fence setting step S4 is illustrated, in the present embodiment, the fence setting step S4 includes a slot dicing step and a surrounding structure forming step. The slot dicing step is implemented by forming a slot 41 that complements the surrounding structure 40 in shape at a predetermined position that is on the sealant 30 and main part 11. More specifically, the slot dicing step is implemented by cutting out the slot 41 on the sealant 30 through methods of using a cutter, a cutting device or a laser processing device. Moreover, the slot dicing step is implemented by cutting from the top of the sealant 31 and partially cutting into the top of the main part 11, so that a bottom of the slot 41 extends to the top of the main part 11.

The surrounding structure forming step is implemented by filling a material that forms the surrounding structure 40 into the slot 41, and the surrounding structure 40 is formed after the material that is filled into the slot 41 is solidified. The top of the surrounding structure 40 is flush with the top of the sealant 30 in the surrounding structure forming step, and a bottom end of the surrounding structure 40 is embedded in the slot 41 that is on the top of the main part 11.

Figure 15:
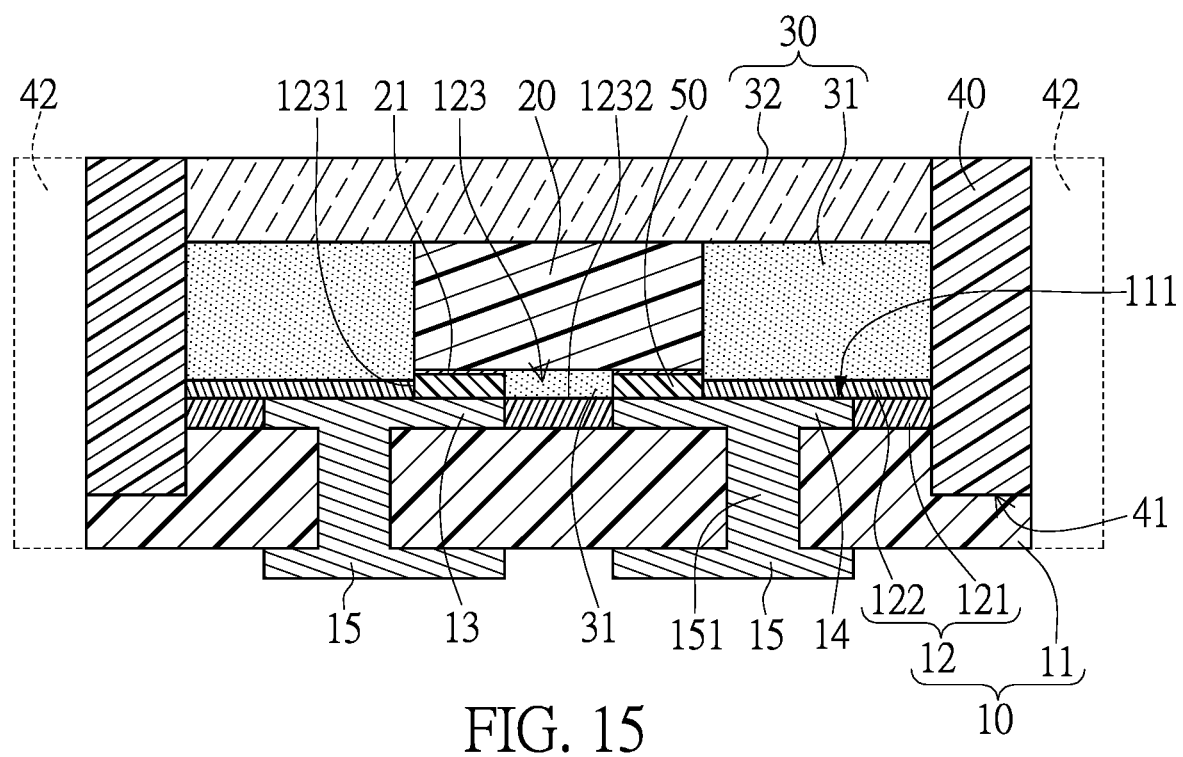
FIG. 15 is an operational schematic view of a dicing step according to the embodiment of the present disclosure.

Referring to FIG. 15, a schematic view of the dicing step S5 is illustrated, in the dicing step S5, a material of a cut-out portion 42 that is along a periphery of the surrounding structure 40 is cut, so that outsides of the main part 11 and the surrounding structure 40 are flat. In addition, a plurality of package structures that are connected to each other is able to be cut into a plurality of independent units to form a finished product of the light emitting package 1 as shown in FIG. 1.

In conclusion, take solder as the bonding layer 50, a beneficial effect is that a flow range of the solder is able to be restricted through the hollow-out structure 123 on the insulating part 12, so that the solder is unable to overflow to an area of a periphery of the chip bonding regions 112 and avoid an issue of short circuit. Furthermore, the beneficial effect avoids crookedness, displacement or an insufficient solder thickness after the light emitting chips 20 is reflowed.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light emitting package comprising:
    a carrier having at least one chip bonding region that is defined by at least two neighboring conductive parts and an insulating part around the least two neighboring conductive parts, wherein a top of the insulating part is higher than tops of the at least two neighboring conductive parts;
    at least one hollow-out structure formed at a portion of the insulating part corresponding in position to the at least one chip bonding region, wherein the at least one hollow-out structure has a side wall surrounding the at least one chip bonding region and a bottom portion being parallel to the at least one chip bonding region, and portions of the tops of the at least two neighboring conductive parts are exposed from the bottom portion, and the tops of the at least two neighboring conductive parts corresponding in position to the at least one hollow-out structure are defined as the least one chip bonding region;
    at least one light emitting chip disposed on the at least one chip bonding region, electrically connected with the exposed portions of the at least two neighboring conductive parts; and
    a sealant disposed on the carrier and surrounding the at least one light emitting chip;
    wherein the insulating part includes a first coating and a second coating, a top of the first coating is flush with the tops of the at least two neighboring conductive parts, the at least one hollow-out structure is formed in the second coating, and the bottom portion of the at least one hollow-out structure is formed on the top of the first coating;
    wherein the sealant further includes a underfill formed between the bottom portion of the at least one hollow-out structure and the at least one light emitting chip.

2. The light emitting package according to claim 1, wherein the top of the insulating part relative to the tops of the at least two neighboring conductive parts is within a range of 15-30 μm.

3. The light emitting package according to claim 1, wherein the insulating part is a multiple solder mask layer.

4. The light emitting package according to claim 1, wherein the light emitting chip is bonded onto the at least one chip bonding region through a bonding layer, and a top of the bonding layer is higher than the top of the insulating part.

5. The light emitting package according to claim 1, wherein the light emitting package further includes at least one surrounding structure disposed on/within the carrier and surrounding the at least one chip bonding region.

6. The light emitting package according to claim 5, wherein the carrier has a slot being recessed in a top thereof and corresponding in position to a bottom of the surrounding structure, and the bottom of the surrounding structure is engaged with the slot.

7. The light emitting package according to claim 1, wherein the carrier is defined as a plurality of light emitting arrays, each of the light emitting arrays has a plurality of the chip bonding regions adjacent to each other, one of the at least two neighboring conductive parts of the plurality of the chip bonding regions of the light emitting arrays are connected to each other, and the other one of the at least two neighboring conductive parts of the plurality of the chip bonding regions are independent from each other.

8. The light emitting package according to claim 7, wherein the top of the insulating part relative to the tops of the at least two neighboring conductive parts is within a range of 15-30 μm.

9. The light emitting package according to claim 7, wherein each of the plurality of the light emitting arrays includes three of the chip bonding regions each defining a longitudinal direction, and wherein in the three chip bonding regions of each of the plurality of the light emitting arrays, two of the three chip bonding regions are arranged side-by-side and the corresponding two longitudinal directions thereof are parallel to each other, a remaining one of the three chip bonding regions is disposed at one side of the two of the three chip bonding regions arranged side-by-side along the two longitudinal directions of the two of the three chip bonding regions, and the longitudinal directions of the two of the three chip bonding regions that are arranged side-by-side are perpendicular to the longitudinal direction of the remaining one of the three chip bonding regions.

10. The light emitting package according to claim 9, wherein the three chip bonding regions of each of the light emitting arrays are arranged side-by-side along a same direction.

11. A manufacturing method of a light emitting package, comprising:
    a preparation step implemented by preparing a carrier, wherein the carrier includes at least one hollow-out structure and at least one chip bonding region formed within the at least one hollow-out structure, wherein portions of two neighboring conductive parts in the at least one chip bonding region are respectively exposed from a bottom portion the at least one hollow-out structure and defined as the at least one chip bonding region;
    a chip bonding step implemented by disposing at least one light emitting chip onto the at least one chip bonding region, wherein two electrodes of the light emitting chip are respectively mounted onto the two neighboring conductive parts through a bonding material; and
    a sealing step implemented by disposing a sealant onto the carrier and covering at least one light emitting chip so as forming a underfill between the bottom portion of the at least one hollow-out structure and the at least one light emitting chip;
    wherein the carrier has a main part and the preparation step includes a first coating procedure and a second coating procedure, wherein the first coating procedure is implemented by disposing a first coating layer on the main part, and the tops of the two neighboring conductive parts are exposed from a top of the first coating layer, and wherein the second coating procedure is implemented by disposing a second coating layer onto the top of the first coating layer and portions of the tops of the two neighboring conductive parts for forming the at least one hollow-out structure by the second coating layer.

12. The manufacturing method of the light emitting package according to claim 11, wherein the chip bonding step is implemented by disposing the bonding material onto the at least one chip bonding region through a template, the template has a plurality of apertures corresponding in position to the at least one chip bonding region of the two neighboring conductive parts, and wherein a total area of the apertures of the template ranges from of 80% to 120% of an area of the at least one chip bonding region within the hollow-out structure, and the bonding material is formed on the at least one chip bonding region through the apertures to form the bonding layer.

13. The manufacturing method of the light emitting package according to claim 12, further comprising a fence setting procedure that is implemented by disposing a surrounding structure onto the carrier so that the surrounding structure surrounds an outside of the at least one chip bonding region and the light emitting chip, and the fence setting procedure including the following steps:
   a slot dicing step including: forming a slot extending from a top of the sealant to the carrier at a predetermined position where the surrounding structure is to be disposed, wherein the slot complements the surrounding structure in shape; and
a surrounding structure forming step including: filling a material into the slot to form the surrounding structure.

14. A light emitting package, comprising:
   a carrier, including:
      a main part having at least one chip bonding region;
      at least two conductive parts disposed on the at least one chip bonding region;
      an insulating part disposed on the main part, wherein a top of the insulating part is higher than tops of the at least two conductive parts; and
      at least one hollow-out structure formed at a portion of the insulating part corresponding in position to the at least one chip bonding region, wherein the at least one hollow-out structure has a side wall and a bottom portion, the side wall surrounds the at least one chip bonding region, and portions of the tops of the at least two conductive parts are exposed from the bottom portion, and the tops of the at least two conductive parts corresponding in position to the at least one hollow-out structure are defined as the at least one chip bonding region;
      wherein the insulating part includes a first coating and a second coating, a top of the first coating is flush with the tops of the at least two conductive parts, the at least one hollow-out structure is formed in the second coating, and the bottom portion of the at least one hollow-out structure is formed on the top of the first coating;
   at least one light emitting chip is bonded onto the at least one chip bonding region and electrically connected with the exposed portions of the at least two neighboring conductive parts through a bonding layer; wherein the second coating is in contact with the bonding layer.

15. The light emitting package according to claim 14, wherein the top of the insulating part relative to the tops of the at least two conductive parts is within a range of 15-30 µm.

16. The light emitting package according to claim 14, wherein a top of the bonding layer is higher than a top of the insulating part.

17. The light emitting package according to claim 14, further includes at least one surrounding structure disposed on/within the carrier and surrounding the at least one chip bonding region.

18. The light emitting package according to claim 14, wherein the carrier is defined as a plurality of light emitting arrays, each of the light emitting arrays has a plurality of the chip bonding regions adjacent to each other, one of the at least two neighboring conductive parts of the plurality of the chip bonding regions of the light emitting arrays are connected to each other, and the other one of the at least two neighboring conductive parts of the plurality of the chip bonding regions are independent from each other.

19. The light emitting package according to claim 18, wherein each of the plurality of the light emitting arrays includes three of the chip bonding regions each defining a longitudinal direction, and wherein in the three chip bonding regions of each of the plurality of the light emitting arrays, two of the three chip bonding regions are arranged side-by-side and the corresponding two longitudinal directions thereof are parallel to each other, a remaining one of the three chip bonding regions is disposed at one side of the two of the three chip bonding regions arranged side-by-side along the two longitudinal directions of the two of the three chip bonding regions, and the longitudinal directions of the two of the three chip bonding regions that are arranged side-by-side are perpendicular to the longitudinal direction of the remaining one of the three chip bonding regions.

* * * * *